United States Patent [19]

Ohdate

[11] Patent Number: 4,972,988
[45] Date of Patent: Nov. 27, 1990

[54] METHOD OF SOLDERING SEMICONDUCTOR SUBSTRATE ON SUPPORTING PLATE

[75] Inventor: Mituo Ohdate, Fukuoka, Japan

[73] Assignee: Mitsubishi Denki Kabushiki Kaisha, Tokyo, Japan

[21] Appl. No.: 422,420

[22] Filed: Oct. 17, 1989

[30] Foreign Application Priority Data

Jul. 25, 1989 [JP] Japan ................... 1-193536

[51] Int. Cl.$^5$ ........................................ H01L 21/58
[52] U.S. Cl. ................................ 228/123; 228/124; 228/198; 228/232; 228/238
[58] Field of Search ............... 228/121, 123, 124, 194, 228/198, 232, 239, 238, 263.12

[56] References Cited

U.S. PATENT DOCUMENTS

| | | | |
|---|---|---|---|
| 4,278,195 | 7/1981 | Singh | 228/124 |
| 4,331,286 | 5/1982 | Miyazaki et al. | 228/198 |
| 4,659,006 | 4/1987 | Polansky | 228/232 |
| 4,771,018 | 9/1988 | Bhattacharyya et al. | 228/238 |
| 4,819,857 | 4/1989 | Mizuishi et al. | 228/124 |

Primary Examiner—Kenneth J. Ramsey
Attorney, Agent, or Firm—Oblon, Spivak, McClelland, Maier & Neustadt

[57] ABSTRACT

In order to solder a silicon substrate on a supporting plate, an aluminum thin plate is inserted therebetween as a solder metal layer. An assembly thus obtained is heated to 580° C. which is higher than the recrystallization temperature 264° C. of the aluminum thin plate but is lower than the eutectic reaction temperature 585° C. of the interface between the silicon substrate and the aluminum thin plate. After the assembly is held at 580° for twenty minutes, the assembly is further heated to 610° C. in order to melt the aluminum thin plate into which silicon atoms are diffused. The aluminum thin plate changes uniformly to an eutectic layer consisting of silicon and aluminum, whereby the silicon substrate is soldered on the supporting plate.

11 Claims, 7 Drawing Sheets

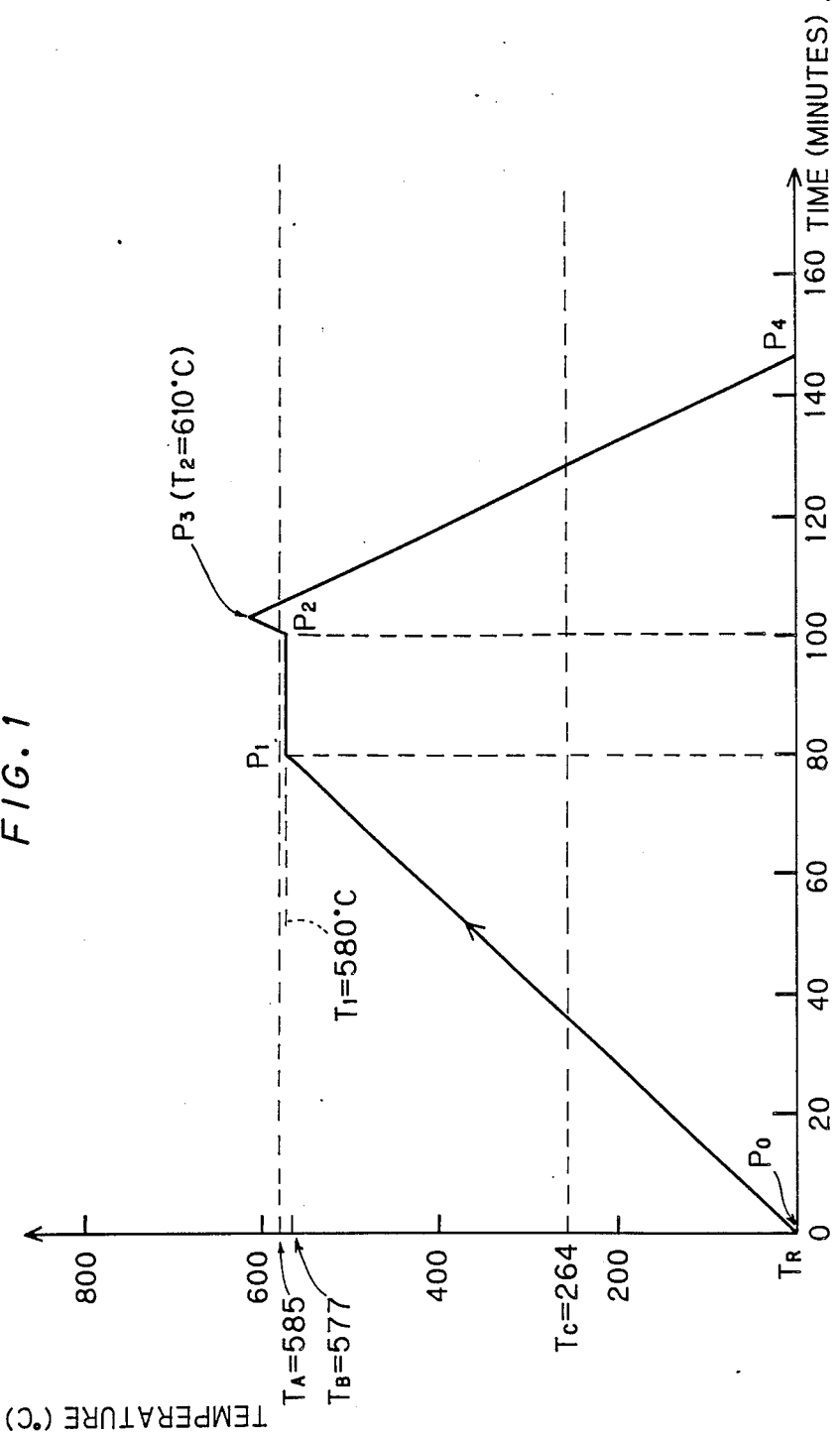

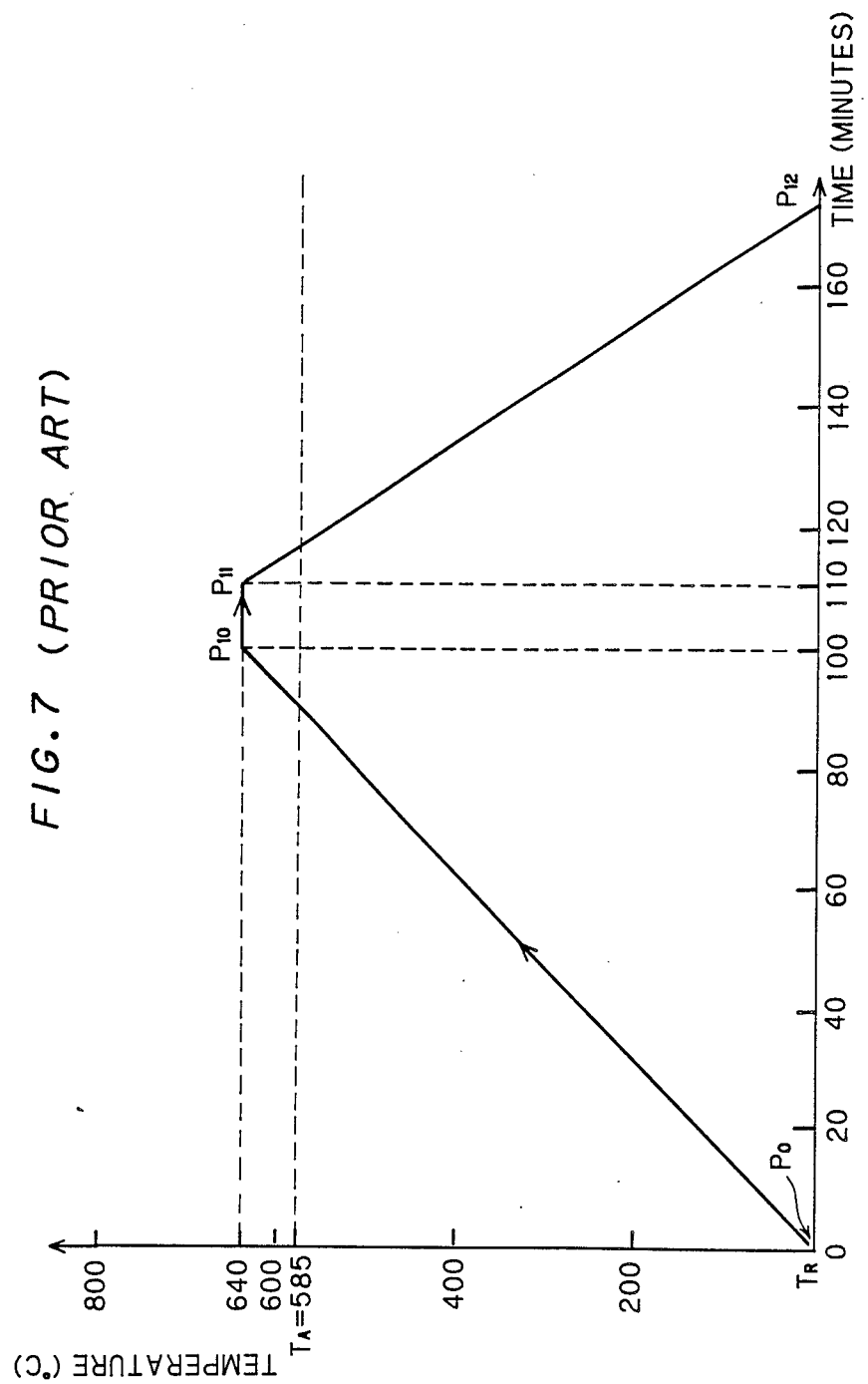

METHOD OF SOLDERING SEMICONDUCTOR SUBSTRATE ON SUPPORTING PLATE

BACKGROUND OF THE INVENTION

1. Field of the Invention

The present invention relates to a method of soldering a semiconductor substrate on a supporting plate, and particularly to an improvement for preventing deterioration in the electronic character of the semiconductor substrate due to a soldering process and for increasing the efficiency of the soldering process.

2. Background Arts

As well known in the field of semiconductor technology, a semiconductor substrate in which one or more electronic elements are formed is often soldered on a supporting metal plate in the process for fabricating semiconductor power devices or the like.

FIG. 6A illustrated an assembly 10 prepared for the process of soldering silicon substrate or wafer 2 on a supporting metal plate 4. A layered structure of an n-type silison region 2a and a p-type silicon region 2b is formed in the silicon substrate 2, whereby the silicon substrate 2 functions as a power diode having a high breakdown-voltage. The supporting metal plate 4 is provided for supporting the silicon substrate 2. The assembly 10 is constructed such that an aluminum thin plate 3 serving as a solder metal layer and the silicon substrate 2 are serially placed on the supporting plate 4 in this order and a weight 1 is further placed thereon.

FIG. 7 is a graph showing the temperature change in a furnace in which the assembly 10 is heated in order to solder the silicon substrate 2 on the supporting plate 4, and the shown temperature is substantially coincident with the temperature of the assembly 10 in the furnace. In the conventional method, the temperature in the furnace is increased from an initial temperature or a room temperature $T_R$ to 640° C. in one hundred minutes (the perion $P_0$-$P_{10}$). The temperature 640° C. is higher than an eutectic reaction temperature $T_A = 585$° C. being defined as a transition temperature at which the silicon and the aluminum thin plate 3 are molten to become an eutectic melt consisting of silicon and aluminum.

Then, the temperature in the furnace is maintained at 640° C. for ten minutes (the period $P_{10}$-$P_{11}$). Therefore, the transition to the eutectic melt starting from the interface between the silicon substrate 2 and the aluminum thin plate 3 spreads over the whole region of the aluminum thin plate 3 in the period $P_{10}$-$P_{11}$, so that the aluminum thin plate 3 becomes an Al—Si eutectic melt layer. The top surface of the supporting metal plate 4 becomes wet with the Al—Si eutectic melt, whereby the silicon substrate 2 is soldered on the supporting plate 4.

Then, the assembly 10 is cooled by natural heat dissipation in the period $P_{11}$-$P_{12}$ so that the Al—Si eutectic melt layer is solidified. The weight 1 is removed from the assembly 10, whereby the soldering process is completed.

FIG. 6B illustrate the silicon substrate 2 which has been soldered on the supporting plate 4 with an Al—Si eutectic solid layer 3a obtained through the above-described process.

Although the conventional technique has been widely used, the same has the following disadvantages: First, attention is directed to the flatness of the silicon substrate 2. The major surfaces of the silicon substrate 2 are shaped into mirror surfaces to a possible extent. However, it is impossible in practice to perfectly avoid irregularities and curvatures of the major surfaces. Furthermore, the surfaces of the aluminum thin plate 3 also have irregularities and curvatures. Therefore, the bottom major surface of the silicon substrate 2 in the assembly 10 is not uniformly in contact with the top surface of the aluminum thin plate 3.

Under the circumstances, the Al—Si eutectic reaction in the period $P_{10}$-$P_{11}$ of the FIG. 7 starts from only the contact regions at which the silicon substrate 2 is well in contact with the aluminum thin plate 3, and then spreads to the other regions, i.e., non-contact regions. That is, the progress of the eutectic reaction is not uniform on the respective regions of the interface between the silicon substrate 2 and the aluminum thin plate 3. In accordance with the non-uniformity, the interface 5 (FIG. 6B) between the Al—Si eutectic layer 3a and the silicon substrate 2 includes flat regions 5a and projection regions 5b projecting into the silicon substrate 2, where the regions 5a and 5b correspond to the non-contact and contact regions, respectively.

As a result, the following problems are caused in the semiconductor device obtained through the soldering process.

(1) Since respective crystallographic structures of the Al—Si eutectic solid layer 3a and the silicon substrate 2 are different from each other, a non-uniform stress is caused in the portion of silicon substrate 2 close to the interface 5, which is the bottom portion of the p-type silicon region 2b in the example shown in FIG. 6B. Accordingly, the electronic character of the diode deviates from the designed character, and the mechanical strength of the diode device is decreased.

(2) When a reverse voltage is applied to the p-n junction J of the diode, the thickness of the depletion layer extending from the p-n junction J to the p-type region 2b becomes non-uniform in respective regions, since the spatial irregularities are caused in the interface 5 between the silicon substrate 2 and the Al—Si eutectic layer 3a whose respective electronic characters are different from each other. Consequently, electronic fields concentrate at the neighborhood of the projection regions 5b and the diode breaks down at a relatively low voltage.

The conventional soldering method causes not only the above-described problems but also the following other problems.

(3) Since the eutectic reaction starts from the contact regions and then spreads to the non-contact regions, the progress of the eutectic reaction is considerably slow and the supporting plate 4 cannot be sufficiently wet with the Al—Si eutectic melt unless the assembly 10 is held at a relatively high temperature in the period $P_{10}$-$P_{11}$. Therefore, the maximum temperature in the furnace which appears in the period $P_{10}$-$P_{11}$ must be relatively high, and accordingly, a thermal stress in the diode becomes high.

(4) In order to accelerate the spread of the eutectic reaction in the non-contact regions, the aluminum thin plate 3 should be sufficiently heated before the eutectic reaction is started. Thus, the heating speed in the period $P_0$-$P_{10}$ should be relatively slow so that the respective regions of the aluminum thin plate 3 can be sufficiently preheated in the period $P_0$-$P_{10}$ for the thermal activation thereof. Consequently, the total time required for the conventional soldering process is long.

SUMMARY OF THE INVENTION

The present invention is directed to a method of soldering a semiconductor substrate on a supporting plate which supports the semiconductor substrate.

According to the present invention, the method comprising the steps of: (a) preparing an assembly in which a solder metal layer is inserted between the semiconductor substrate and the supporting plate; (b) heating the assembly to a first temperature which is higher than a recrystallization temperature of the solder metal layer but is lower than a first melting point at which a portion of the solder metal layer being in contact with the semiconductor substrate comes to be molten; (c) holding the assembly at the first temperature for a predetermined time period; (d) heating the assembly to a second temperature higher than the first melting point; and (e) cooling the assembly from the second temperature to a third temperature lower than the first temperature.

In a present embodiment of the present invention, the first temperature is selected such that a difference between the first temperature and the first melting point is smaller than a difference between the first temperature and the recrystallization temperature.

Preferably, the first temperature is selected within a temperature range around a second melting point at which an alloy consisting of the semiconductor material forming the semiconductor substrate and the solder metal forming the solder metal layer comes to be molten.

The solder metal layer is softened in the step (c), and the surface thereof is deformed. Local gaps which may exist in the interface between the semiconductor substrate and the solder metal layer are filled with the deformed solder metal, and the semiconductor substrate comes to be fully contact with the solder metal layer. That is, the surface of the solder metal layer is made to conform to the surface of the semiconductor substrate. Since the first temperature is higher than the recrystallization temperature of the solder metal layer, the hardness of the solder metal layer comes low at the first temperature and a plastic deformation is caused in the solder metal layer. The first treperature is lower than the first melting point of the portion of the solder metal layer being in contact with the semiconductor substrate, which will be called as "an interface melting point", and therefore, the solder metal layer is not molten at the step (c).

By performing the step (d) after the step (c) is completed, the assembly is heated to the second temperature higher than the interface melting point. Accordingly, the solder metal layer comes to be molten. Since the solder metal layer is fully in contact with the semiconductor substrate, the thermal reaction between the solder metal layer and the semiconductor substrate progresses uniformly at respective areas of the interface and the solder metal layer becomes a metal/semiconductor alloy layer. Therefore, it is prevented that the metal/semiconductor alloy layer partially projects into the semiconductor substrate.

Furthermore, since the solder metal layer has fully conformed to the semiconductor substrate before the solder metal layer is molten, it is not necessary to hold the assembly at a high temperature for a long time in order to convert the solder metal to the metal/semiconductor alloy. The heating speed at the step (b) may be high, because the process of making the solder metal layer conform to the semiconductor substrate is conducted in the next process step (c).

In an aspect of the present invention, the method comprises the steps of: (a) designating a solder metal; (b) finding a softening temperature at which the solder metal comes to be soften to a predetermined softness level; (c) preparing an assembly in which a solder metal layer made of the solder metal is inserted between the semiconductor substrate and the supporting plate; (d) heating the assembly to a first temperature which is higher than the softening temperature but is lower than a melting point of a portion of the solder metal layer being in contact with the semiconductor substrate; (e) holding the assembly at the first temperature for a predetermined time period; (f) heating the assembly to a second temperature higher than the melting point; and (g) cooling the assembly from the second temperature to a third temperature lower than the first temperature.

An interface between the semiconductor substrate and the solder metal layer in the assembly which is prepared in the step (c) may have contact regions in which the semiconductor substrate is in contact with the solder metal layer and non-contact regions in which the semiconductor substrate is not in contact with the solder metal layer, i.e., local gaps corresponding to the non-contact regions may exist in the interface. Preferably, the predetermined softening level is determined so that a part of the solder metal layer which is thermally softened in the step (e) can be deformed by a predetermined force applied to the interface and the local gaps can be filled with the part thus deformed.

The softening temperature may be found with reference to the character curve of the hardness of the solder metal, or alternatively, may be found by experiments.

Accordingly, an object of the present invention is to provide a soldering method in which a non-uniform stress is not caused in a semiconductor substrate soldered on a supporting plate.

Another object is to improve the breakdown voltage and other electronic characters of a semiconductor device which is obtained from the soldered semiconductor substrate.

Another object is to decrease the maximum temperature in the heating sequence for the soldering process to thereby decrease the thermal stress in the semiconductor substrate and the electric power for the soldering process.

Another object is to decrease the total time of the soldering process.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a graph showing a heating sequence of an assembly according to a preferred embodiment of the present invention, FIG. 7 is a graph showing a conventional heating sequence of the assembly shown in FIG. 6A.

DESCRIPTION OF PREFERRED EMBODIMENTS

Figure 2A:
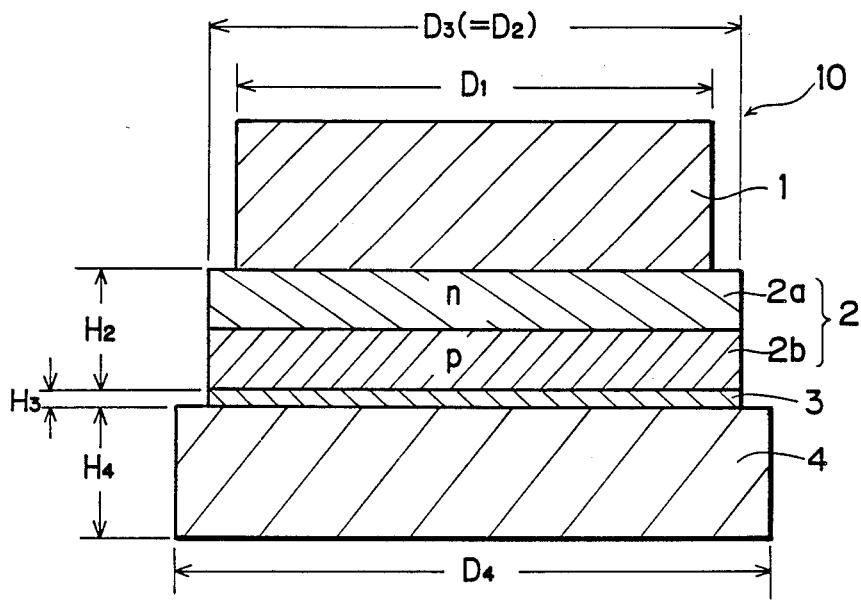
FIG. 2A is a sectional view of the assembly in which a solder metal layer is inserted between a semiconductor substrate and a supporting plate.
Figure 6A:
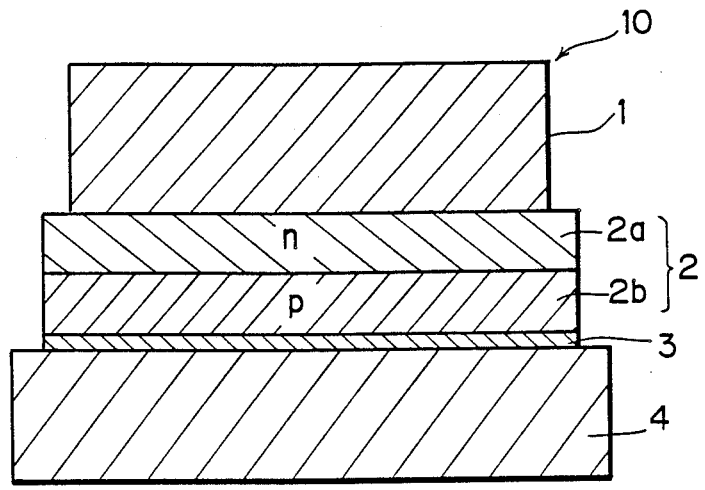
FIG. 6A is a sectional view of an assembly which is subjected to a soldering process.
Figure 6B:
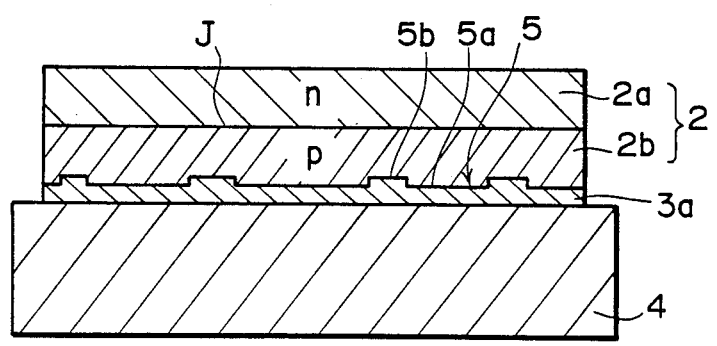
FIG. 6B is a sectional view of the assembly after a conventional soldering process.

FIG. 2A illustrates an assembly 10 employed in a soldering process according to a preferred embodiment of the present invention. The assembly 10 has a structure similar to that shown in FIG. 6A, and the details thereof are as follows:

The lowest member in the assembly 10 is a supporting plate 4 provided for supporting a silicon substrate 2 thereon. The supporting plate 4 is made of molybdenum and has a diameter $D_4 = 70$ mm and a thickness $H_4 = 3$ mm. In the drawings, respective thicknesses of the elements or members forming the assembly 10 are illustrated in an exaggerated manner for convenience of illustration as compared with respective diameters.

An aluminum thin plate 3 having a diameter $D_3 = 69.5$ mm and a thickness $H_3 = 0.03$ mm is placed on the top surface of the supporting plate 4, the aluminum thin plate 3 serving as a solder metal layer. The silicon substrate or wafer 2 which is placed on the top surface of the aluminum thin plate 3 has a diameter $D_2 = 69.5$ mm ($= D_3$) and a thickness $H_2 = 0.6$ mm. An n-type silicon region 2a and a p-type silicon region 2b are formed in the silicon substrate 2, whereby the silicon substrate 2 serves as a power diode having a high breakdown voltage. The p-type silicon region 2b, i.e., an anode region, is in contact with the aluminum thin plate 3.

Figure 4A:
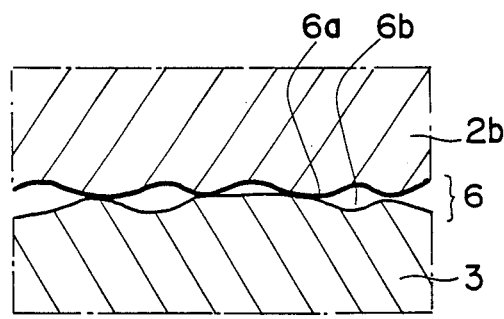
FIG. 4A, FIG. 4B and FIG. 4C are partial enlarged views of the interface between the semiconductor substrate and the solder metal layer.

A weight 1 having a diameter $D_1 = 69$ mm and a mass of 0.8 kg is placed on the top major surface of the silicon substrate 2. As shown in FIG. 4A as an enlarged partial cross section, the bottom major surface of the silicon substrate 2 (i.e., that of the p-type region 2b) and the top surface of the aluminum thin plate 3 may have spatial irregularities and/or curvatures. In such a case, contact regions 6a and non-contact regions 6b distribute at random in the boundary portion 6 between the silicon substrate 2 and the aluminum thin plate 3.

Figure 3:
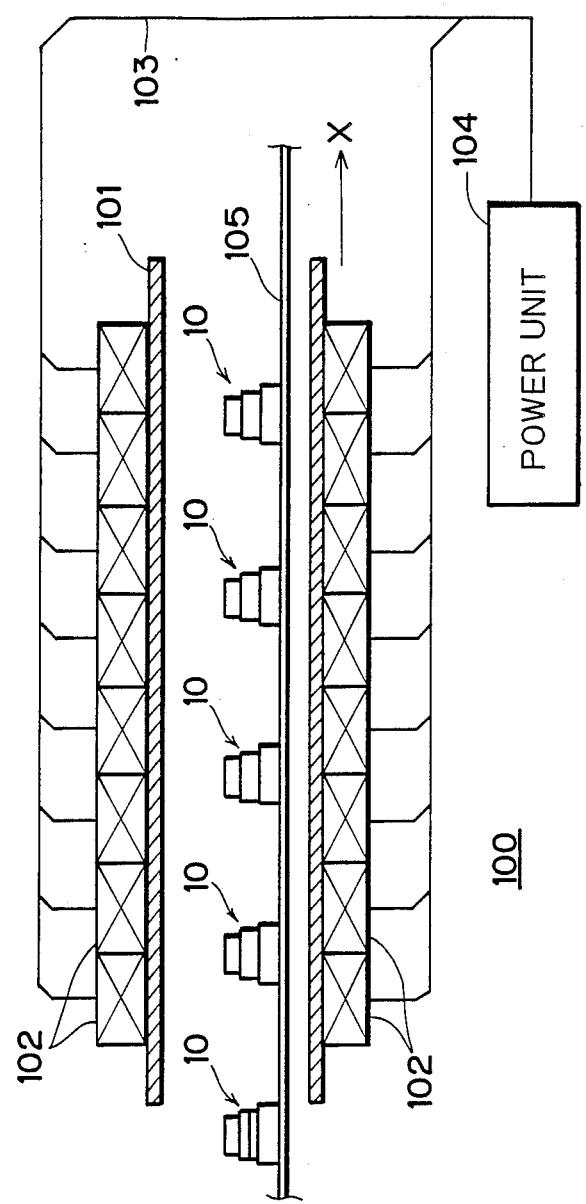
FIG. 3 illustrates a continuous-type furnace employed in the preferred embodiment.

FIG. 3 illustrates a furnace 100 employable for heating the assembly 10 in order to solder the bottom major surface of the silicon substrate 2 on the top surface of the supporting plate 4 with the aluminum thin plate 3. Although the soldering process can be conducted with either of a continuous-type furnace and a batch-type furnace, the furnace 100 shown in FIG. 3 is the former type, and a soldering process with the latter type furnace will be described later.

The furnace 100 has a quartz heater tube 101 having shape of a hollow cylinder. A number of heater units 102 are aligned on the heater tube 101, and each of the heater units 102 generates a heat by receiving an electric power delivered from a power unit 104 through power lines 103. An inert gas such as a nitrogen ($N_2$) gas is supplied to the inner space of the heater tube 101.

Provided through the heater tube 101 is a conveyer 105 moving in the axial direction X of the heater tube 101 at a constant speed. A number of assemblies 10 are placed on the conveyer 105 at regular intervals. As the conveyer 105 moves, each of the assemblies 10 enters the heater tube 101 from one opening thereof, and after subjected to the soldering process in the heater tube 101, the same goes-out from the other opening of the heater tube 101.

Each of the heater units 102 is individually supplied with an electric power form the power unit 104, and respective electric powers for the heater units 102 are controlled such that the spatial distribution of temperature in the heater tube 101 with respect to the direction X is substantially coincident with the graph obtained by regarding the time axis in FIG. 1 as a distance in the direction X. Therefore, the temperature change of each assembly 10 passing through the heater tube 101 is substantially represented by the graph shown in FIG. 1.

Referring to FIG. 1, the soldering process according to the preferred embodiment of the present invention will be now described. First, the assembly 10 is heated such that the temperature of the assembly 10 increases from the room temperature $T_R$ to a first temperature $T_1 = 580°$ C. in eighty minutes (the period $P_0$-$P_1$). Then, the temperature of the assembly 10 is maintained at the first temperature $T_1 = 580°$ C. for twenty minutes (the period $P_1$-$P_2$). The period $P_1$-$P_2$ is provided in order that the top and bottom surfaces of the aluminum thin plate 3 may be plastically deformed by the gravity of the weight 1 and the substrate 2, and the local gaps between the aluminum thin place 3 and the silicon substrate 2 may be filled with the deformed portions of the aluminum thin plate 3 before an Al—Si eutectic reaction is started at the interface between the aluminum thin plate 3 and the silicon substrate 2. The following is an analysis of and a criterion for determining the first temperature $T_1$ in accordance with the character of the period $P_1$-$P_2$:

The aluminum thin plate 3 is produced by rolling an aluminum ingot or slab, and therefore, the aluminum thin plate 3 commercially available has been hardened due to the work hardening in the rolling and the like. When the hardened thin plate is heated, recrystallization of the aluminum atoms stars at the intrinsic recrystallization temperature thereof, and the hardness of the aluminum thin plate is drastically decreased, i.e., the aluminum thin plate is softened, at the recrystallization temperature. The recrystallization temperature $T_C$ of the aluminum thin plate 3 being employed in the preferred embodiment is $T_C = 264°$ C. Therefore, the first temperature $T_1$ is selected within temperature values higher than the recrystallization temperature $T_C = 264°$ C.

On the other hand, the eutectic reaction temperature $T_A$ is $T_A = 585°$ C. The eutectic reaction temperature $T_A$ corresponds to a melting point of the regions of the aluminum thin plate 3 being in contact with the silicon substrate 2, which is hereinafter referred to as "an interface melting point". In other words, the eutectic reaction temperature $T_A$ is a transition temperature at which aluminum and silicon at the interface between the silicon substrate 2 and the aluminum thin plate 3 start to be molten and to become an eutectic melt substantially consisting of aluminum and silicon. The first temperature $T_1$ is selected within temperature values lower than the eutectic reaction temperature $T_A$.

According to the above-indicated two conditions, the first temperature $T_1$ is selected within the temperature range:

$$T_C < T_1 < T_A \quad (1)$$

In general, a solder metal layer is softened as the temperature thereof is increased. Therefore, it is preferred that the first temperature $T_1$ is close to the eutectic reaction temperature $T_A$ within the temperature range (1). In particular, it is the best mode that the first temperature $T_1$ is determined by the melting point of the eutectic which consists of the semiconductor forming the substrate 2 and the metal forming the solder metal layer 3. This melting point will be referred to as "an eutectic melting point". In the example shown in FIG. 2A, the semiconductor and the metal are silicon and aluminum, respectively, and therefore, the eutectic melting point is the melting point of Al—Si eutectic. It is to be noted that the "interface melting point" or the eutectic reaction temperature $T_A$ is a melting point at which the metal and the semiconductor being in contact with each other at the macroscopic contact boundary between the solder metal layer and the semiconductor substrate start to be molted and to become an eutectic melt, while the "eutectic melting point" is a melting point of a metal/semiconductor system forming an eutectic structure in a microscopic or crystallographic sense. In general, the following inequality (2) is obtained from the phase diagrams of various eutectic systems (not shown).

$$T_B < T_A \quad (2)$$

The eutectic melting point $T_B$ of the Al—Si system is $T_B = 577°$ C.

Accordingly, in the case where the silicon substrate 2 and the aluminum thin plate 3 are employed as in the preferred embodiment, the first temperature $T_1$ is selected within the temperature range:

$$T_C(264° C.) < T_1 < T_A(585° C.) \quad (3)$$

and, preferably, the temperature $T_1$ is selected according to the condition:

$$T_1 \simeq T_B(577° C.) < T_A(585° C.) \quad (4)$$

It will be easily confirmed that the first temperature $T_1 = 580°$ C. which is employed in the preferred embodiment satisfy both of the conditions (3) and (4).

Figure 4B:
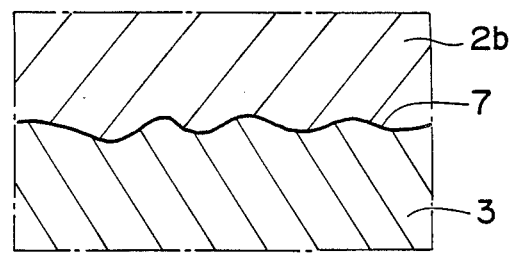

By maintaining the temperature of the assembly 10 at the first temperature $T_1 = 580°$ C. for a predetermined time period, e.g., twenty minutes, the top surface of the aluminum thin plate 3 is plastically deformed due to the gravity of the weight 1 and the other member placed on the aluminum thin plate. Consequently, the non-contact regions or gaps 6b are filled with the deformed portions of the aluminum thin plate 3, whereby the p-type silicon region 2b and the aluminum thin plate 3 come in contact with each other all over the interface thereof, as shown in FIG. 4B.

In other words, the top surface of the aluminum thin plate 3 comes to conform to the bottom surface of the silicon substrate 2 by holding the assembly 10 at the first temperature $T_1$. Furthermore, the bottom surface of the aluminum thin plate 3 comes fully in contact with the top surface of the supporting plate 4 through the plastic deformation thereof. In the period $P_1$–$P_2$, silicon atoms and aluminum atoms are exchanged across the interface 7 between the aluminum thin plate 3 and the p-type regin 2b through the interface diffusion or the grain diffusion of these elements.

Figure 4C:
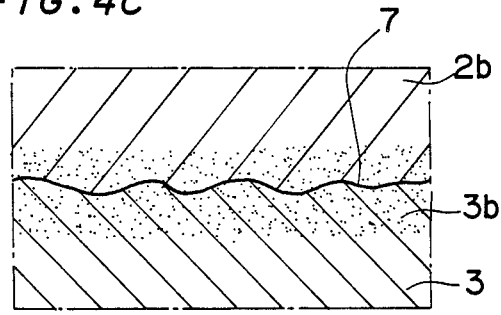

In the next period $P_2$–$P_3$ in FIG. 1, the temperature of the assembly 10 is increased from the first temperature $T_1 = 580°$ C. to a predetermined second temperature $T_2 = 610°$ C. The second temperature $T_2$ is higher than the eutectic reaction temperature $T_A = 585°$ C. Accordingly, when the temperature of the assembly 10 reaches at and exceeds the eutectic reaction temperature $T_A = 585°$ C., a portion of the aluminum thin plate 3 being in contact with the silicon substrate 2 is molten together with silicon atoms having been diffused therein, and an eutectic reaction thereof starts, so that the vicinites of the interface 7 become an Al—Si eutectic melt layer 3b as shown in FIG. 4C. Then, the eutectic reaction spreads to respective regions of the aluminum thin plate 3, and the whole of the aluminum thin plate 3 becomes the Al—Si eutectic melt layer 3b. The top surface of the supporting plate 4 comes to wet with the Al—Si eutectic melt, whereby the silicon substrate 2 is soldered on the supporting plate 4.

Then, the assembly 10 is cooled to the room temperature $T_R$ in the next period $P_3$–$P_4$ through a natural heat dissipation, i.e., a natural cooling by stopping the heating, whereby the Al—Si eutectic melt layer 3b is solidified to become an Al—Si eutectic solid layer. The weight 1 is then removed from the assembly 10, and the soldering process is now completed.

Figure 2B:
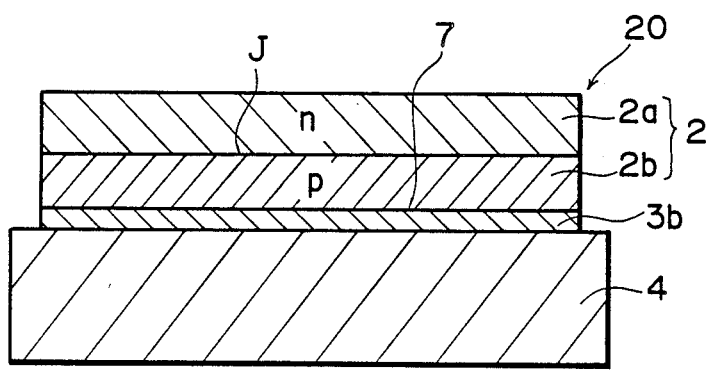
FIG. 2B is a sectional view of the assembly after a soldering process.

The characteristic advantages of the soldering process according to the preferred embodiment of the present invention are as follows:

(1) The eutectic reaction of aluminum and silicon progresses uniformly from respective areas in the top surface of the aluminum thin plate 3, since the eutectic reaction starts under the condition where the aluminum thin plate 3 is fully in contact with the silicon substrate 2. Consequently, the Al—Si eutectic layer 3b does not partially project into the p-type silicon region 2b in an assembly 20 (FIG. 2B) which is obtained through the soldering process. As a result, a local stress is not caused in the silicon substrate 2, and therefore, an abnormality in the electronic character of the obtained diode and the decrease in the mechanical strength of the diode are effectively prevented.

(2) When a reverse voltage is applied to the diode, a depletion layer extends uniformly form the p-n junction J into the p-type silicon region 2b since the Al—Si eutectic layer does not partially project into the p-type region 2b. Therefore, the diode has a high breakdown voltage.

(3) Because the eutectic reaction is carried out under the condition where the aluminum thin plate 3 is fully in contact with the silicon substrate 2, the maximum temperature in the soldering process can be decreased. That is, the maximum temperature in the conventional method (FIG. 7) is 640° C., while that is 610° C. in the preferred embodiment (FIG. 1). The eutectic reaction progresses uniformly at a relatively high speed, and the supporting plate 4 can be sufficiently wet with the Al—Si eutectic melt 3b at the relatively low temperature 610° C.

(4) The process step for making the aluminum thin plate 3 conform to the silicon substrate 2 is conducted at the first temperature $T_1$ and therefore, it is not required to preheat the assembly 10 for a long time. That is, the heating speed of the assembly 10 in the period $P_0$–$P_1$ of FIG. 1 can be increased as compared with the period $P_0$–$P_{10}$ of FIG. 7. Furthermore, since the eutectic reaction progresses fast at temperatures higher than the eutectic reaction temperature $T_A$, it is not necessary to hold the assembly 10 at the second temperature $T_2$ for a long time. In the example shown in FIG. 1, the assembly 10 is cooled immediately after the temperature of the assembly 10 reaches at the second temperature $T_2$. Thus, the total time of the soldering process can be shortened. For example, a time longer than one hundred and seventy minutes is required for completing the conventional soldering process, while only one hundred and fifty minutes or less are required for completing the soldering process according to the preferred embodiment.

Consequently, according to the present invention, the various problems in the conventional soldering process are solved only by improving the heating sequence of the assembly 10.

The following are other preferred embodiments of the present invention:

(1) The material of the solder metal layer may be a metal other than aluminum. In the present invention, the word "metal" is used in a broad sense, and it represents not only a simple metal but also an alloy. In the process of soldering a semiconductor substrate on a supporting plate, it is preferred to employ a hard solder metal having a high melting point. For example, Ag—Cu solder, silver solder (Pb-Sn-Ag) or the like may be used in place of aluminum.

A solder metal which is selected for the assembly 10 may be a metal (or alloy) which does not form an eutectic with the semiconductor material of the substrate 2. For example, the selected solder metal may form a pertectic with the semiconductor. Therefore, the temperature $T_A$ is not limited to an "eutectic reaction temperature" and is defined as an interface melting point at which a portion of the solder metal layer being in contact with the semiconductor substrate 2 is molten.

Under the general concept of the temperature $T_A$, the temperatures $T_A$ and $T_C$ of Ag—Cu solder and silver solder used as the solder metal layer are shown in Table 1. Similarly to the aluminum thin plate, the first temperature $T_1$ and the second temperature $T_2$ are determined according to the inequality (1).

TABLE 1

|  | Ag—Cu | Pb—Sn—Ag |
|---|---|---|
| $T_A$ | 780° C. | 305° C. |
| $T_C$ | 312° C. | 122° C. |

(2) Since the hardness of a solder metal layer decreases drastically at the recrystallization temperature $T_C$ thereof, the first temperature $T_1$ is selected within temperatures higher than the recrystallization temperature $T_C$, as has been described. However, even if the recrystallization temperature $T_C$ is not known, the first temperature $T_1$ can be determined through the following process:

First, a sample of the assemblies 10 is prepared, and the value of the first temperature $T_1$ is arbitrarily selected. Then, the soldering process is conducted for the sample assembly by heating the sample assembly in accordance with the heating sequence corresponding to the sequence in FIG. 1 in which the first temperature $T_1$ is set at the selected value. The soldered part of the obtained diode device is analized in order to judge whether or not the selected value is suitable for softening the solder metal layer 3. The analysis may be conducted by investigating the crystallographic structure of the diode at the soldered part thereof, or alternatively, by measuring the electronic character of the diode.

If the eutectic layer 3b projects partially into the substrate 2, it is concluded that the solder metal layer 3 is not sufficiently softened at the selected value of the first temperature $T_1$. Consequently, a new value higher than the old selected value is further selected, and the soldering process is conducted for another sample assembly while employing new value as the first temperature $T_1$. The soldered diode is also analized.

By repeating the above-indicated test process, the lower limit of the required first temperature $T_1$ can be found. In a production line of semiconductor devices, the first temperature $T_1$ is set at a value which is higher than the lower limit but is lower than the interface melting point $T_A$.

On the other hand, if the softening curve of the solder melt layer 3 which represents the relationship between the hardness and the temperature is known, the first temperature $T_1$ can be determined without finding the recrystallization temperature $T_C$ thereof. That is, the critical temperature at which the softness of the solder metal increases drastically is found from the softening curve, and the critical temperature is employed as the lower limit of the first temperature.

Attention is now turned to the application range of the first temperature $T_1$ which is determined through one of the above-indicated processes. The diameter of the semiconductor substrate 2 depends on that of the employed wafer. Therefore, it would be useful for practical soldering processes to know whether or not the lower limit of the first temperature $T_1$ which is found for one value of the diameter of the substrate 2 can be applied to substrates having other diameters. The answer thereof is obtained from the rule that the lower limit of the first temperature $T_1$ is substantially common to respective diameters as long as the force per unit area which is applied between the substrate 2 and the solder metal layer 3 from the weight 1 is substantially in a same level.

For example, the force per unit area which is applied in the assembly 10 shown in FIG. 2A due to the gravity of the weight 1 is estimated as:

$$0.8 \text{ kg}/\pi \cdot (34.8 \text{ mm})^2 = 21.0 \text{ g/cm}^2 \quad (5)$$

Consequently, even if the diameter of the substrate is different from 69.5 mm, result of the soldering is same with or better than that for the substrate 2 having the diameter 69.5 mm as long as the mass of the weight 1 is changed such that a force substantially equal to or larger than the force 21.0 g is applied to each unit area of the interface between the semiconductor substrate and the solder metal layer. For example, in the case where the mass of the weight 1 is 2 kg and the area of each major surface of the substrate 2 is 34 cm², the force which is applied to each unit area of the interface between the substrate 2 and the solder metal layer 3 is:

$$18.7 \text{ g/cm}^2 \quad (6)$$

which is in the same degree with the value 21.0 g/cm² in the equation (5). Therefore, the lower limit of the first temperature $T_1$ may be common to the two cases.

On the other hand, when the first temperature $T_1$ is set at a value close to the interface melting point $T_A$ as the example shown in FIG. 1, the solder metal layer 3 is well softened without taking the dependence of the lower limit on the mass of the weight 1 into consideration.

In summary, although it is most convenient that the lower limit of the first temperature $T_1$ is found from the recrystallization temperature $T_C$ of the solder metal layer, the lower limit can be determined as long as the temperature at which the solder metal layer 3 is softened to a predetermined level is found through an arbitrary method. The predetermined level is such that the non-contact regions or local gaps in the interface between the substrate and the solder metal layer is filled with the softened portion of the solder metal layer.

(3) The heating control may be carried out such that the assembly 10 is held at the second temperature $T_2$ for a predetermined non-zero time. Although the desirable soldering can be attained even if the assembly 10 is cooled immediately after the assembly 10 reaches at the second temperature $T_2$ as shown in FIG. 1, the modification of the heating control for holding the assembly 10 at the second temperature $T_2$ for a non-zero time is included in the scope of the present invention.

Figure 5:
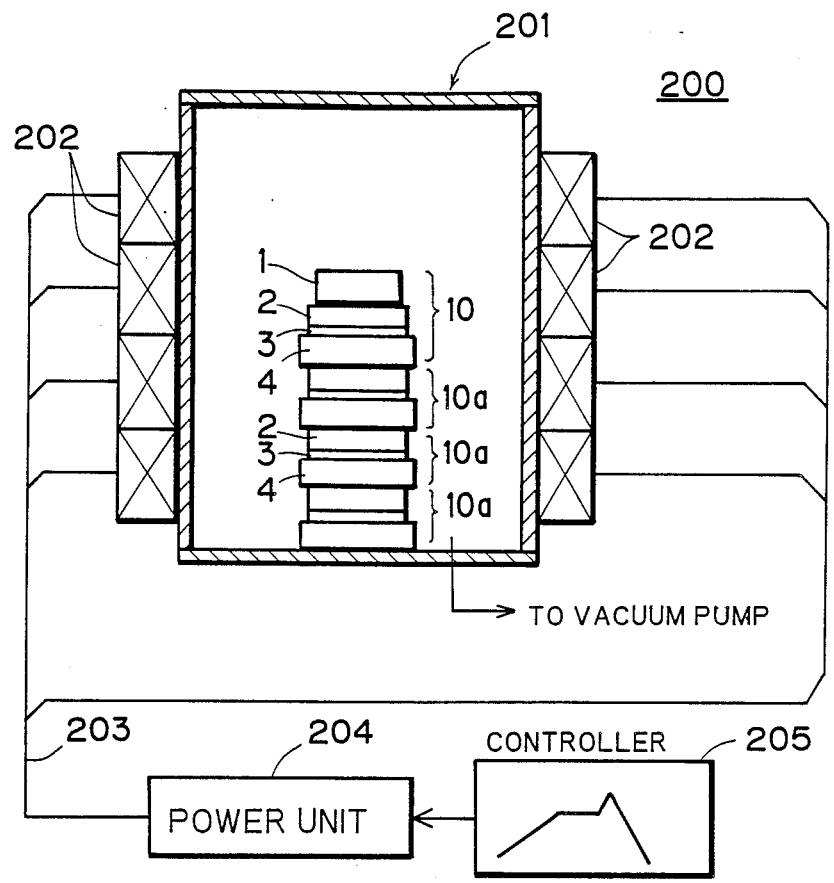
FIG. 5 illustrates a batch-type furnace which is also employable in the preferred embodiment.

(4) FIG. 5 illustrates a batch-type furnace 200, and the present invention can be applied to a soldering process using the furnace 200. The furnace 200 comprises a heating box 201 resistant to a high temperature, around which heater units 202 are provided. The heater units generate heats by receiving electric powers from a power unit 204 through power lines 203. A controller 205 controls the output powers of the power unit 204. The internal space of the heating box 201 communicates with a vacuum pump through a pipe line and valves (not shown).

In the heating box 210, assemblies 10 and 10a are stacked up. The top assembly 10 has a same structure with that shown in FIG. 2A and includes a weight 1 on the top portion thereof, while the other assemblies 10a have no weights 1 therein.

The controller 205 has a memory in which data representing the heating sequence shown in FIG. 1 are previously stored. The controller 205 generates a signal representing the heating sequence and outputs the signal to the power unit 204. In response to the signal, the power unit 204 delivers electric powers to the heater units 202 so that the heater units 202 generate heats according to the heating sequence of FIG. 1. The assemblies 10 and 10a receive the heats and the soldering process in each assembly 10, 10a is conducted.

Since the present invention is mainly characterised in the improvement of a heating sequence, the type of an employed furnace is not limited. Therefore, the present invention can be embodied in various modes.

(5) In the case where the soldering process is performed in order to product semiconductor power devices, the material of the supporting plate 4 is selected within materials whose thermal expansion coefficient are substantially equal to that of the material forming the semiconductor substrate 2. In the example shown in FIG. 2A, the thermal expansion coefficient of silicon is $3.2 \times 10^{-6} K^{-1}$, while that of molydenum forming the supporting plate 4 is in the range from $4.2 \times 10^{-6}$ to $5.0 \times 10^{-6} K^{-1}$. Such a selection is effective for reducing the interface stress between the substrate 2 and the supporting plate 4 which is caused by the difference between respective thermal expansion coefficients when the soldered assembly 10 is cooled. In particular, this condition is important when the area of the major surfaces of the substrate 2 is relatively large as in semiconductor power devices.

However, the present invention can be applied to the production process of various semiconductor devices as well as power devices. Accordingly, the material of the supporting plate 4 is not limited in the present invention. Furthermore, the electronic element which is formed in the semiconductor substrate 2 may be a transistor, a thyrister or the like rather than a diode. The present invention can be applied to either of a discrete semiconductor element and an integrated circuit device.

Although the present invention has been described and illustrated in detail, it is clearly understood that the same is by way of illustration and example only and is not to be taken by way of limitation. The spirit and scope of the present invention being limited only by the terms of the appended claims.

I claim:

1. A method of soldering a semiconductor substrate on a supporting plate which supports said semiconductor substrate, comprising the steps of:
    (a) preparing an assembly in which a solder metal layer is inserted between said semiconductor substrate and said supporting plate;
    (b) heating said assembly to a first temperature which is higher than a recrystallization temperature of said solder metal layer but is lower than a first melting point at which a portion of said solder metal layer being in contact with said semiconductor substrate comes to be molten;
    (c) holding said assembly at said first temperature for a predetermined time period;
    (d) heating said assembly to a second temperature higher than said first melting point; and
    (e) cooling said assembly from said second temperature to a third temperature lower than said first temperature.

2. A method of claim 1, wherein
said first temperature is selected such that a difference between said first temperature and said first melting point is smaller than a difference between said first temperature and said recrystallization temperature.

3. A method of claim 2, wherein
said semiconductor substrate is substantially made of a semiconductor material,
said solder metal layer is substantially made of a solder metal, and
said first temperature is selected within a temperature range around a second melting point at which an alloy consisting of said semiconductor material and said solder metal comes to be molten.

4. A method of claim 3, wherein
said first temperature is between said first and second melting points.

5. A method of claim 4, wherein
the step (e) includes the step of:
cooling said assembly to said third temperature immediately after said assembly reaches at said second temperature.

6. A method of claim 5, wherein
said solder metal layer changes by the step (d) to an eutectic melt layer essentially consisting of said semiconductor material and said solder metal.

7. A method of claim 6, wherein
said semiconductor material is silicon,
said solder metal is aluminum, said first and second temperatures are about 580° C. and 610° C., respectively, and said time period is about twenty minutes.

8. A method of soldering a semiconductor substrate on a supporting plate which supports said semiconductor substrate, comprising the steps of:
   (a) designating a solder metal;
   (b) finding a softening temperature at which said solder metal comes to be soften to a predetermined softness level;
   (c) preparing an assembly in which a solder metal layer made of said solder metal is inserted between said semiconductor substrate and said supporting plate;
   (d) heating said assembly to a first temperature which is higher than said softening temperature but is lower than a melting point of a portion of said solder metal layer being in contact with said semiconductor substrate;
   (e) holding said assembly at said first temperature for a predetermined time period;
   (f) heating said assembly to a second temperature higher than said melting point; and
   (g) cooling said assembly from said second temperature to a third temperature lower than said first temperature.

9. A method of claim 8, wherein
   an interface between said semiconductor substrate and said solder metal layer in said assembly which is prepared in the step (c) has contact regions in which said semiconductor substrate is in contact with said solder metal layer and non-contact regions in which said semiconductor substrate is not in contact with said solder metal layer, whereby local gaps corresponding to said non-contact regions exist in said interface, and
   said predetermined softening level is determined so that a part of said solder metal layer which is thermally softened in the step (e) can be deformed by a predetermined force applied to said interface and said local gaps can be filled with said part thus deformed.

10. A method of claim 9, wherein
    said assembly has structure in which said supporting plate, said solder metal layer, said semiconductor substrate and a weight member are stacked up in this order, and
    said predetermined force includes a gravity of said weight member.

11. A method of claim 10, wherein
    said solder metal layer is a solder metal plate which has been hardened due to a work hardening in production of said solder metal plate, and
    said softening temperature is found from a recrystallization temperature of said solder metal plate.

* * * * *